United States Patent
Chen et al.

(10) Patent No.: US 10,643,965 B2
(45) Date of Patent: May 5, 2020

(54) STRUCTURE AND METHOD OF FORMING A JOINT ASSEMBLY

(71) Applicant: Taiwan Semiconductor Manufacturing Company, Ltd., Hsin-Chu (TW)

(72) Inventors: Ying-Ju Chen, Tuku Township (TW); An-Jhih Su, Taoyuan (TW); Hsien-Wei Chen, Hsin-Chu (TW); Der-Chyang Yeh, Hsin-Chu (TW); Chi-Hsi Wu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 109 days.

(21) Appl. No.: 15/254,758

(22) Filed: Sep. 1, 2016

(65) Prior Publication Data

US 2017/0345786 A1 Nov. 30, 2017

Related U.S. Application Data

(60) Provisional application No. 62/341,466, filed on May 25, 2016.

(51) Int. Cl.
*H01L 23/00* (2006.01)
*H01L 25/10* (2006.01)

(52) U.S. Cl.
CPC .............. *H01L 24/32* (2013.01); *H01L 24/05* (2013.01); *H01L 24/13* (2013.01); *H01L 24/16* (2013.01);

(Continued)

(58) Field of Classification Search
CPC ..... H01L 2924/00014; H01L 2224/131; H01L 2224/13144; H01L 2224/81815; H01L 2924/01322; H01L 2924/00; H01L 2924/014; H01L 2224/13017; H01L 2224/13076; H01L 2224/1308;

(Continued)

(56) References Cited

U.S. PATENT DOCUMENTS 5,470,787 A * 11/1995 Greer ...................... H01L 24/10
228/180.22
2009/0188706 A1* 7/2009 Endo .................... H05K 3/4007
174/257

(Continued)

*Primary Examiner* — Mark W Tornow
*Assistant Examiner* — Priya M Rampersaud
(74) *Attorney, Agent, or Firm* — Slater Matsil, LLP

(57) ABSTRACT

A method of manufacturing a semiconductor device structure includes forming a bond or joint between a first device and a second device. The first device comprises an integrated passive device (IPD) and a first contact pad disposed over the IPD. The second device comprises a second contact pad. The first contact pad has a first surface with first lateral extents. The second contact pad has a second surface with second lateral extents. The width of the second lateral extents is less than the width of the first lateral extents. The joint structure includes the first contact pad, the second contact pad, and a solder layer interposed therebetween. The solder layer has tapered sidewalls extending in a direction away from the first surface of the first contact pad to the second surface of the second contact pad. At least one of the first surface or the second surface is substantially planar.

20 Claims, 9 Drawing Sheets

(52) U.S. Cl.
CPC .............. *H01L 24/27* (2013.01); *H01L 24/29* (2013.01); *H01L 24/83* (2013.01); *H01L 25/105* (2013.01); *H01L 24/03* (2013.01); *H01L 24/11* (2013.01); *H01L 24/20* (2013.01); *H01L 24/48* (2013.01); *H01L 24/81* (2013.01); *H01L 2224/0345* (2013.01); *H01L 2224/0347* (2013.01); *H01L 2224/03462* (2013.01); *H01L 2224/03464* (2013.01); *H01L 2224/03912* (2013.01); *H01L 2224/0401* (2013.01); *H01L 2224/04026* (2013.01); *H01L 2224/04105* (2013.01); *H01L 2224/05017* (2013.01); *H01L 2224/05024* (2013.01); *H01L 2224/05147* (2013.01); *H01L 2224/05166* (2013.01); *H01L 2224/05558* (2013.01); *H01L 2224/05572* (2013.01); *H01L 2224/05624* (2013.01); *H01L 2224/05647* (2013.01); *H01L 2224/05666* (2013.01); *H01L 2224/05684* (2013.01); *H01L 2224/1144* (2013.01); *H01L 2224/1145* (2013.01); *H01L 2224/11462* (2013.01); *H01L 2224/12105* (2013.01); *H01L 2224/131* (2013.01); *H01L 2224/13019* (2013.01); *H01L 2224/13124* (2013.01); *H01L 2224/13147* (2013.01); *H01L 2224/13166* (2013.01); *H01L 2224/13184* (2013.01); *H01L 2224/16145* (2013.01); *H01L 2224/16227* (2013.01); *H01L 2224/27462* (2013.01); *H01L 2224/29026* (2013.01); *H01L 2224/32145* (2013.01); *H01L 2224/32148* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/8191* (2013.01); *H01L 2224/81121* (2013.01); *H01L 2224/81125* (2013.01); *H01L 2224/81193* (2013.01); *H01L 2224/81801* (2013.01); *H01L 2224/81815* (2013.01); *H01L 2224/81895* (2013.01); *H01L 2225/0651* (2013.01); *H01L 2225/06568* (2013.01); *H01L 2225/1035* (2013.01); *H01L 2225/1058* (2013.01); *H01L 2924/1203* (2013.01); *H01L 2924/1205* (2013.01); *H01L 2924/1206* (2013.01); *H01L 2924/1207* (2013.01); *H01L 2924/15311* (2013.01); *H01L 2924/181* (2013.01)

(58) Field of Classification Search
CPC . H01L 2224/13082; H01L 2224/16058; H01L 2224/16148; H01L 2224/16225; H01L 2224/16238; H01L 2224/73204; H01L 2224/81143; H01L 2224/81191; H01L 2225/06513; H01L 2225/06593; H01L 24/13; H01L 24/16; H01L 24/81; H01L 25/0657; H01L 25/50; H01L 2924/381; H01L 2924/0002; H01L 2225/0651; H01L 2225/06541; H01L 23/29; H01L 23/31; H01L 24/29; H01L 25/065; H01L 25/07; H01L 25/18; H01L 2224/11462; H01L 2224/13025; H01L 2224/13083; H01L 23/49816; H01L 24/11; H01L 2224/32225; H01L 2224/48227; H01L 2224/73265; H01L 2224/19; H01L 2224/48091; H01L 2924/15311; H01L 2224/83005; H01L 2924/00012; H01L 21/4857; H01L 21/486; H01L 21/56; H01L 21/568; H01L 2224/04105; H01L 2224/12105; H01L 2224/73267; H01L 2224/92244; H01L 2225/1035; H01L 2225/1041; H01L 2225/1058; H01L 23/3128; H01L 23/49811; H01L 24/19; H01L 24/20; H01L 25/105; H01L 2924/14

See application file for complete search history.

(56) References Cited

U.S. PATENT DOCUMENTS

| | | | |
|---|---|---|---|
| 2010/0140752 A1* | 6/2010 | Marimuthu | H01L 23/3121 257/621 |
| 2010/0165585 A1* | 7/2010 | Lin | H01L 23/642 361/748 |
| 2011/0298101 A1* | 12/2011 | Pagaila | H01L 21/561 257/659 |
| 2012/0012997 A1* | 1/2012 | Shen | H01L 23/49816 257/737 |
| 2012/0074532 A1* | 3/2012 | Shih | H01L 23/3171 257/629 |
| 2013/0277830 A1* | 10/2013 | Yu | H01L 24/16 257/737 |
| 2013/0334684 A1* | 12/2013 | Lin | H01L 23/49838 257/737 |
| 2014/0061897 A1* | 3/2014 | Lin | H01L 24/06 257/737 |
| 2014/0113446 A1* | 4/2014 | Pendse | H01L 21/563 438/613 |
| 2014/0151867 A1* | 6/2014 | Lin | H01L 28/00 257/676 |
| 2015/0037936 A1* | 2/2015 | Shen | H01L 23/3157 438/106 |
| 2015/0255433 A1* | 9/2015 | Daizo | H01L 23/49811 257/737 |
| 2016/0358877 A1* | 12/2016 | Chou | H01L 23/498 |
| 2017/0117245 A1* | 4/2017 | Lin | H01L 25/50 |
| 2017/0133346 A1* | 5/2017 | Chiu | C23C 18/42 |
| 2017/0236797 A1* | 8/2017 | Yu | H01L 24/81 257/692 |

* cited by examiner

STRUCTURE AND METHOD OF FORMING A JOINT ASSEMBLY

PRIORITY CLAIM AND CROSS-REFERENCE

This application claims priority to U.S. Provisional Application No. 62/341,466, filed on 25 May 2016, entitled "Structure for IPD Joint," which application is incorporated herein by reference.

BACKGROUND

Semiconductor devices are used in a variety of electronic applications, such as, e.g., personal computers, cell phones, digital cameras, and other electronic equipment. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits may be manufactured on a single semiconductor wafer. The individual dies are singulated by sawing the integrated circuits along scribe lines. The individual dies are then packaged separately, e.g., in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components use smaller and more advanced packaging systems than packages of the past, in some applications.

BRIEF DESCRIPTION OF THE DRAWINGS

Aspects of the present disclosure are best understood from the following detailed description when read with the accompanying Figures. It is noted that, in accordance with standard practice in the industry, various features may not be drawn to scale. In fact, the dimensions of various features may be arbitrarily increased or reduced for clarity of discussion or illustration.

DETAILED DESCRIPTION

Figure 1A:
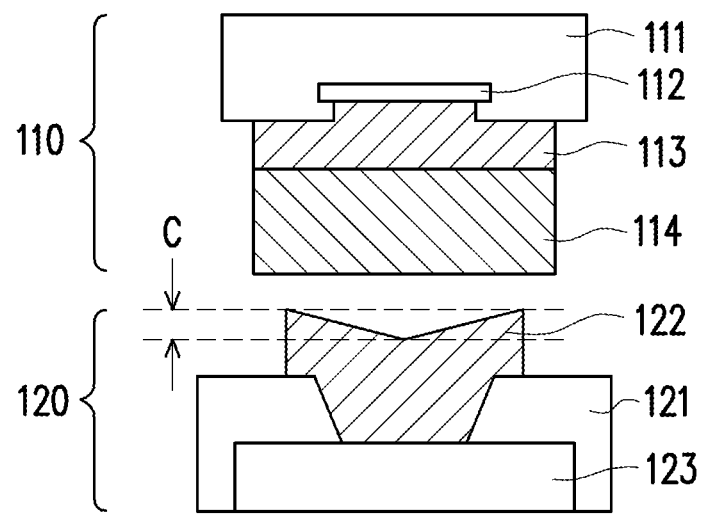
FIGS. 1A and 1B are cross-sectional views illustrating a joint structure formed between a first device and a second device, in accordance with a representative embodiment.

The following disclosure provides many different embodiments, or examples, for implementing different features of the disclosure. Specific examples of components and arrangements are provided below to simplify the present description. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. Additionally, the present disclosure may repeat reference numerals and/or letters in various examples. This repetition is for the purpose of simplicity and clarity, and does not in itself dictate a relationship between various embodiments and/or configurations discussed.

Further, spatially relative terms, such as "beneath," "below," "lower," "above," "upper," and the like, may be used herein for ease of description to reference one element's or feature's relationship to another element or feature as representatively illustrated in the Figures. Spatially relative terms are intended to encompass different orientations of the device in use or operation, in addition to the orientations depicted in the Figures. Apparatuses may be otherwise oriented (e.g., rotated 90 degrees, or at other orientations) and spatially relative descriptors used herein may likewise be interpreted accordingly.

Conventional joint structures and methods for forming same may include or otherwise produce one or more gaps, voids, or holes disposed within a joint structure formed between bonded semiconductor devices. Such gaps, voids, or holes may be interposed between bonded semiconductor devices within a conductive material (e.g., solder) electrically coupling the semiconductor devices together. As used herein, the term "solder" may be understood to mean any conductive or partially conductive material that may be reflowed (or may otherwise achieve an at least partial phase change or phase transition) with application of thermal energy. Such gaps, voids, or holes generally render joint structures with which they are associated susceptible to reliability considerations during quality control testing. Representative embodiments of the present disclosure provide improved joint/bond structures between joined/bonded semiconductor devices that are substantially free of gaps, voids, and/or holes.

Figure 1B:
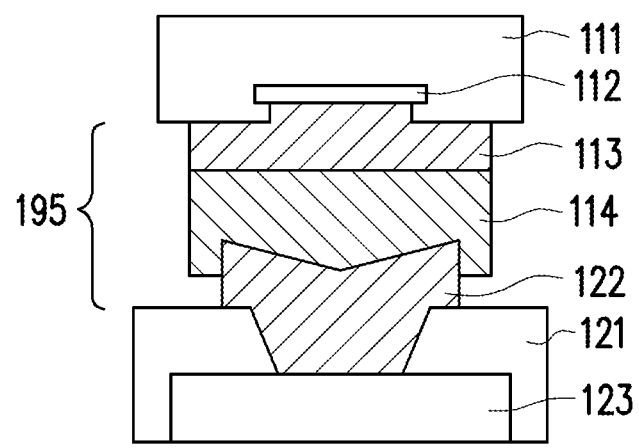

FIG. 1A and FIG. 1B representatively illustrate formation of a joint structure 195 between a first semiconductor device 110 and a second semiconductor device 120 in accordance with an embodiment. First semiconductor device 110 comprises an integrated passive device (IPD) 112 and an IPD package substrate 111. In a representative embodiment, first semiconductor device 110 may include a silicon substrate. In other embodiments, first semiconductor device 110 may comprise one or more other suitable elemental semiconductors (e.g., diamond or germanium), a suitable compound semiconductor (e.g., gallium arsenide, silicon carbide, indium arsenide, or indium phosphide), or a suitable alloy semiconductor (e.g., silicon germanium carbide, gallium arsenic phosphide, or gallium indium phosphide). The substrate may be a silicon on insulator (SOI) or silicon on sapphire. In some embodiments, first semiconductor device 110 may comprise a gradient semiconductor layer, and/or may further include a semiconductor layer overlying another semiconductor layer of a different type, such as a silicon layer on a silicon germanium layer. In other examples, a compound semiconductor substrate may comprise a multilayer silicon structure, or a silicon substrate may include a multilayer compound semiconductor structure. The substrate, in one embodiment, may be based on an insulating core such as a fiberglass reinforced resin core. A representative core material comprises fiberglass resin, such as FR4. Other core materials include bismaleimide-triazine (BT) resin, or alternatively, other printed circuit board (PCB) materials or films. Build up films, such as Ajinomoto build-up film (ABF) or other laminate materials, may be used for fabricating first semiconductor device 110. In alternative or conjunctive embodiments, first semiconductor device 110 and IPD package substrate 111 may comprise an encapsulant or molding compound material, a polymer (e.g., epoxy, vinylester, polyester, and/or the like), a fiber-reinforced polymer (e.g., comprising glass, carbon, aramid, basalt, etc.), and/or the like.

First semiconductor device 110 may include active devices, in addition to passive devices. Active devices may comprise a wide variety of devices (e.g., diodes, transistors, field-effect transistors, thyristors, and/or the like). Passive devices (e.g., capacitors, resistors, inductors, and/or the like) may be used to provide desired structural and/or functional features of a particular first semiconductor device 110 design. The active devices and passive devices may be formed using any suitable methods, either within or on IPD package substrate 111.

With patterning and etching, e.g., a recess may be formed from a front-side-facing (or top) exterior surface of IPD package substrate 111 to expose at least a portion of IPD 112. Patterning may be accomplished by any acceptable process, such as by employing lithographic exposure of a photosensitive material, followed by development and etching (e.g., an anisotropic etch). Subsequent patterning and deposition of conductive features in and over the recess may be employed to produce first contact pad 113. In some embodiments, a seed layer may comprise a metal layer deposited in the recessed formed to expose IPD 112. The seed layer may be a single layer or a composite layer having a plurality of sub-layers formed of different materials. In some embodiments, the seed layer may comprise a titanium layer and a copper layer over the titanium layer. The seed layer may be formed using, for example, physical vapor deposition (PVD), or the like. Photoresist may then be formed and patterned on the seed layer. The photoresist may be deposited (e.g., by spin coating, or the like) and exposed to light for patterning. The pattern of the photoresist corresponds to feature definitions of subsequently formed first contact pad 113. Patterning forms openings through the photoresist to expose the seed layer. A conductive material is formed in the openings of the photoresist and on exposed portions of the seed layer. The conductive material may be formed by plating (e.g., electroplating or electroless plating, or the like), sputtering, PVD, or the like. The conductive material may comprise a metal, e.g., copper, titanium, tungsten, aluminum, or the like. Thereafter, photoresist and portions of the seed layer on which conductive material is not formed are removed. The photoresist may be removed by acceptable ashing or stripping processes, e.g., using an oxygen plasma, or the like. Once the photoresist is removed, exposed portions of the seed layer may be removed, such as by using a suitable etching process (e.g., wet or dry etching). Remaining portions of the seed layer and conductive material form first contact pad 113. First contact pad 113 may be formed to have a thickness (e.g., from a front-side facing surface of IPD package substrate 111 to a front-side facing surface of first contact pad 113) of between about 10 μm and about 70 μm, such as about 50 μm.

As will be discussed further herein with reference to FIGS. 4, 5, and 6, by selecting a ratio of the lateral width (e.g., FIG. 4, width B) of the recessed portion of first contact pad 113 to the width (e.g., FIG. 4, width W') of the lateral extents of first contact pad 113, a substantially planar front-side-facing surface of first contact pad 113 may be produced. See, U.S. patent application Ser. No. 14/815,169 filed on 31 Jul. 2015, entitled "Redistribution Lines Having Stacking Vias," which application is hereby incorporated herein by reference.

Solder layer 114 is deposited over and on the top surface of first contact pad 113. In a representative embodiment, solder layer 114 may be deposited by electroplating solder material to the top surface of first contact pad 113; however, various other deposition techniques for forming solder layer 114 may be alternatively or conjunctively employed (e.g., evaporation, printing, solder transfer, or the like). Where solder material is electroplated on first contact pad 113, the top surface shape of first contact pad 113 is transferred to solder layer 114 (e.g., in this case, a planar or substantially planar surface). As used herein, the phrase "substantially planar" may be understood to mean that a height difference for any two areas of a particular feature's surface does not exceed about 10% of the thickness the feature. For example, the top surface of first contact pad 113 may be considered to be planar or substantially planar if no two areas of the top surface have a difference in height larger than about 10% of the thickness of first contact pad (e.g., a smallest distance between the top surface of first contact pad 113 and the top surface of IPD package substrate 111). By way of further example, the top surface of solder layer 114 may be considered to be planar or substantially planar if no two areas of the top surface have a difference in height larger than about 10% of the thickness of solder layer 114.

Second semiconductor device 120 comprises encapsulant layer 121, redistribution layer (RDL) 123, and second contact pad 122. Encapsulant layer 121 may comprise a molding compound, a polymer, and/or the like. In some representative embodiments, second semiconductor device 120 may comprise a silicon substrate or other substrate material as representatively recited for first semiconductor device 110 above. Second semiconductor device 120 may include active and passive devices. Active devices may comprise a wide variety of devices (e.g., diodes, transistors, field-effect transistors, thyristors, and/or the like). Passive devices (e.g., capacitors, resistors, inductors, and/or the like) may be used to provide desired structural and/or functional features of a particular second semiconductor device 120 design. The active devices and passive devices may be formed using any suitable methods.

With lithographic patterning and etching, e.g., a recess may be formed from front-side-facing exterior surface of encapsulant layer 121 to expose at least a portion of RDL 123. Patterning may be accomplished by any acceptable process. Subsequent patterning and deposition of metallization features in and over the recess may be employed to produce second contact pad 122. In some embodiments, a seed layer may comprise a metal layer deposited in the recessed formed to RDL 123. The seed layer used to form second contact pad 122 may have the same composition as (or a different composition than) the seed layer used to form first contact pad 113. The process used to form the seed layer of the second contact pad 122 may be the same as (or different than) the process used to form the seed layer of the first contact pad 113. Photoresist may then be formed and patterned on the seed layer. The pattern of the photoresist corresponds to feature definitions of subsequently formed second contact pad 122. Conductive material may thereafter be deposited on the seed layer to form second contact pad 122. The process(es) and material(s) used to form second contact pad 122 may be the same as (or different than) the process(es) and material(s) used to form first contact pad 113. Second contact pad 122 may be formed to have a thickness (e.g., from a front-side facing surface of encapsulant layer 121 to a front-side facing surface of second contact pad 122) of between about 10 µm and about 70 µm, such as about 50 µm.

Second contact pad 122 may be formed to have a front-side-facing, substantially concave shape or dished top surface profile, as representatively illustrated, e.g., in FIG. 1A. For example, where electroplating of conductive material on the seed layer is employed, deposition of the conductive material will generally proceed in a substantially isotropic fashion—thereby generally producing a concave shape or dished top surface profile for second contact pad 122. The depth of the substantially concave cavity C of second contact pad 122 may be, e.g., from about 1.0 µm to about 7.0 µm.

With reference to FIG. 1B, a pick-and-place tool may be used to physically align first semiconductor device 110 with second semiconductor device 120. After alignment, the pick-and-place tool lands first semiconductor device 110 on second semiconductor device 120 by bringing the top surface of solder layer 114 into contact with the top surface of second contact pad 122. A thermal (e.g., reflow) process is performed to form joint structure 195. Joint structure 195 physically and electrically bonds first semiconductor device 110 to second semiconductor device 120. As representatively illustrated in FIG. 1B, a portion of solder layer 114 may wet a portion of the sidewalls of second contact pad 122 outside lateral extents of second contact pad 122. An optional flux cleaning process may thereafter be performed. In other embodiments, any suitable connector or connection process may be utilized, such as metal-to-metal bonding, or the like.

As used herein, the phrase "similar to (or different than)," and contextual variants thereof, may be understood to mean that the referenced elements may be formed by one or more similar (or different) processes and/or may comprise one or more similar (or different) materials.

Figure 2A:
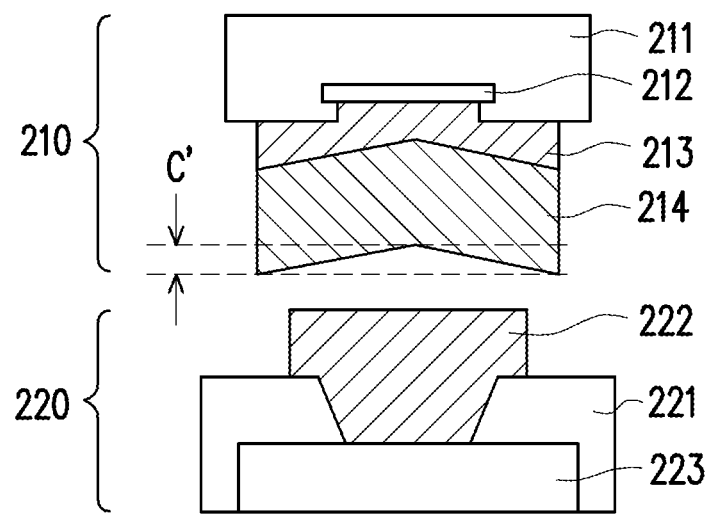
FIGS. 2A and 2B are cross-sectional views illustrating a joint structure formed between a first device and a second device, in accordance with another representative embodiment.
Figure 2B:
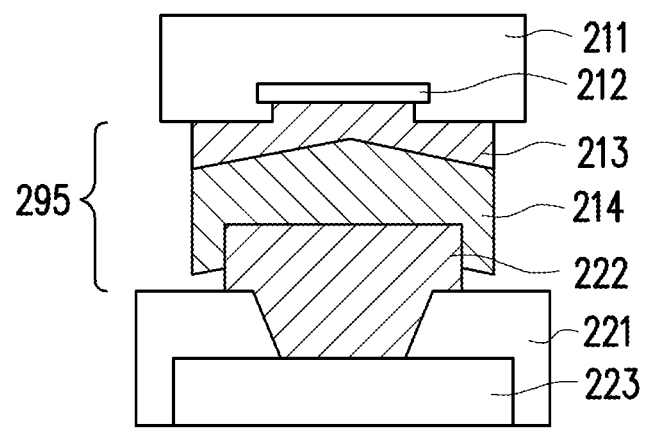

FIG. 2A and FIG. 2B representatively illustrate formation of a joint structure 295 between a first semiconductor device 210 and a second semiconductor device 220 in accordance with an embodiment. First semiconductor device 210 may be similar to (or different than) first semiconductor device 110. First semiconductor device comprises IPD 212, which may be similar to (or different than) IPD 112. First semiconductor device comprises IPD package substrate 211, which may be similar to (or different than) IPD package substrate 111. IPD package substrate 211 may include active and passive devices that are similar to (or different than) those comprising IPD package substrate 111. IPD package substrate 211 may include first contact pad 213, which may be similar to (or different than) first contact pad 113. First contact pad 213 may be formed to have a thickness (e.g., from the front-side facing surface of IPD package substrate 211 to the front-side facing surface of first contact pad 213) of between about 10 µm and about 70 µm, such as about 50 µm.

First contact pad 213 may be formed to have a front-side-facing, substantially concave shape or dished top surface profile, as representatively illustrated, e.g., in FIG. 2A. For example, where electroplating of conductive material on a seed layer forms first contact pad 213, deposition of the conductive material will generally proceed in a substantially isotropic fashion—thereby generally producing a concave shape or dished top surface profile for first contact pad 213. The depth of the concave or substantially concave cavity C' of first contact pad 213 may be, e.g., from about 1.0 µm to about 7.0 µm.

Solder layer 214 may be similar to (or different than) solder layer 114. In a representative embodiment, solder layer 214 may be deposited by electroplating solder material to the top surface of first contact pad 213; however, various other deposition techniques for forming solder layer 214 may be alternatively or conjunctively employed. Where solder material is electroplated on first contact pad 213, the top surface shape of first contact pad 213 is transferred to solder layer 214 (e.g., in this case, a concave or substantially concave cavity or shape).

Second semiconductor device 220 may be similar to (or different than) second semiconductor device 120. For example, second semiconductor device 220 may comprise encapsulant layer 221, RDL 223, and second contact pad 222. Second contact pad 222 may be formed to have a thickness (e.g., from a front-side facing surface of encapsulant layer 221 to a front-side facing surface of second contact pad 222) of between about 10 µm and about 70 µm, such as about 50 µm.

By selecting a ratio of the lateral width (e.g., FIG. 5, width A) of the recessed portion of second contact pad 222 to the width (e.g., FIG. 5, width W) of the lateral extents of second contact pad 222, a substantially planar front-side-facing surface of second contact pad 222 may be produced.

With reference to FIG. 2B, a pick-and-place tool may be used to physically align first semiconductor device 210 with second semiconductor device 220. After alignment, the pick-and-place tool lands first semiconductor device 210 on second semiconductor device 220 by bringing the top surface of solder layer 214 into contact with the top surface of second contact pad 222. A thermal process is performed to form joint structure 295. Joint structure 295 physically and electrically bonds first semiconductor device 210 to second semiconductor device 220. As representatively illustrated in FIG. 2B, a portion of solder layer 214 may wet a portion of the sidewalls of second contact pad 222 outside lateral extents of second contact pad 222. An optional flux cleaning process may thereafter be performed. In other embodiments, any suitable connector or connection process may be utilized, such as metal-to-metal bonding, or the like.

Figure 3A:
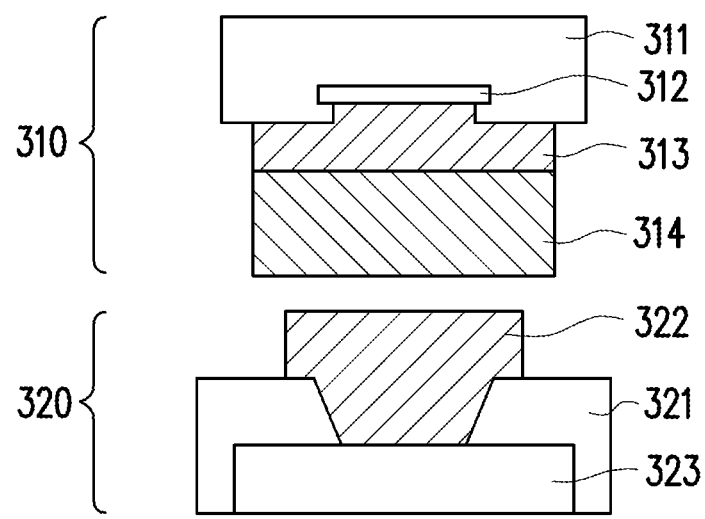
FIGS. 3A and 3B are cross-sectional views illustrating a joint structure formed between a first device and a second device, in accordance with yet another representative embodiment.
Figure 3B:
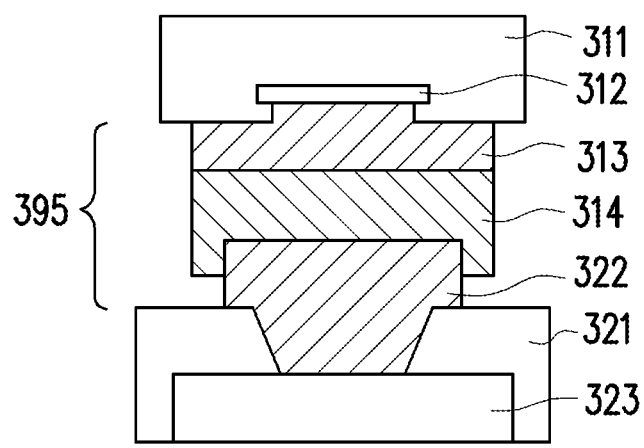

FIG. 3A and FIG. 3B representatively illustrate formation of a joint structure 395 between a first semiconductor device 310 and a second semiconductor device 320 in accordance with another embodiment. First semiconductor device 310 may be similar to (or different than) first semiconductor device 110. First semiconductor device comprises IPD 312, which may be similar to (or different than) IPD 112. First semiconductor device comprises IPD package substrate 311, which may be similar to (or different than) IPD package substrate 111. IPD package substrate 311 may include active and passive devices that are similar to (or different than) those comprising IPD package substrate 111. IPD package substrate 311 may include first contact pad 313, which may be similar to (or different than) first contact pad 113. First contact pad 313 may be formed to have a thickness (e.g., from a front-side facing surface of IPD package substrate 311 to a front-side facing surface of first contact pad 313) of between about wpm and about 70 μm, such as about 50 μm.

First contact pad 313 may be formed to have a front-side-facing, substantially planar shape, as representatively illustrated, e.g., in FIG. 3A. By selecting a ratio of the lateral width (e.g., FIG. 6, width B) of the recessed portion of first contact pad 313 to the width (e.g., FIG. 6, width W') of the lateral extents of first contact pad 313, a substantially planar front-side-facing surface of first contact pad 313 may be produced.

Solder layer 314 is deposited over and on the top surface of first contact pad 313. In a representative embodiment, solder layer 314 may be electroplated to the top surface of first contact pad 313; however, various other deposition techniques for forming solder layer 214 may be alternatively or conjunctively employed (e.g., evaporation, printing, solder transfer, or the like). Where solder material is electroplated on first contact pad 313, the top surface shape of first contact pad 313 is transferred to solder layer 314 (e.g., in this case, a planar or substantially planar shape).

Second semiconductor device 320 may be similar to (or different than) second semiconductor device 320. For example, second semiconductor device 320 may comprise encapsulant layer 321, RDL 323, and second contact pad 322. Second contact pad 222 may be formed to have a thickness (e.g., from a front-side facing surface of encapsulant layer 321 to a front-side facing surface of second contact pad 322) of between about 10 μm and about 70 μm, such as about 50 μm.

By selecting a ratio of the lateral width (e.g., FIG. 6, width A) of the recessed portion of second contact pad 322 to the width (e.g., FIG. 6, width W) of the lateral extents of second contact pad 322, a substantially planar front-side-facing surface of second contact pad 322 may be produced.

With reference to FIG. 3B, a pick-and-place tool may be used to physically align first semiconductor device 310 with second semiconductor device 320. After alignment, the pick-and-place tool lands first semiconductor device 310 on second semiconductor device 320 by bringing the top surface of solder layer 314 into contact with the top surface of second contact pad 322. A thermal process is performed to form joint structure 395. Joint structure 395 physically and electrically bonds first semiconductor device 310 to second semiconductor device 320. As representatively illustrated in FIG. 3B, a portion of solder layer 314 may wet a portion of the sidewalls of second contact pad 322 outside the lateral extents of second contact pad 322. An optional flux cleaning process may thereafter be performed. In other embodiments, any suitable connector or connection process may be utilized, such as metal-to-metal bonding, or the like.

Figure 4:
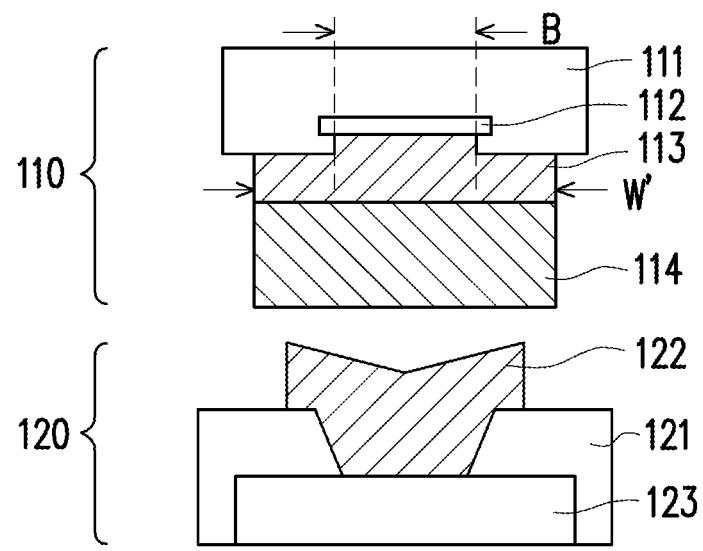
FIG. 4 is a cross-sectional view illustrating relative dimensions for elements of a joint assembly in accordance with the representative embodiment generally illustrated in FIG. 1A.

FIG. 4 representatively illustrates relative dimensions for elements subsequently forming a joint structure or assembly in accordance with the representative embodiment generally illustrated in FIG. 1A for first semiconductor device 110 and second semiconductor device 120. Width B represents a lateral width for the recessed portion of first contact pad 113. Width W' represents a lateral width of first contact pad 113. Where the order of magnitude of widths W' and B are about 1E-06 μm to about 1E-05 μm, a ratio of W':B of about 5:2 will produce a substantially planar front-side-facing (or top) surface of first contact pad 113 in accordance with U.S. patent application Ser. No. 14/815,169, previously incorporated herein by reference. Subsequent electroplating of solder layer 114 on first contact pad 113 will transfer the planar top surface shape of first contact pad 113 to the top surface of solder layer 114. In a representative embodiment, width W' may be about 50 μm and width B may be about 20 μm. W' may be less than or equal to about 50 μm. B may be less than or equal to about 20 μm.

Figure 5:
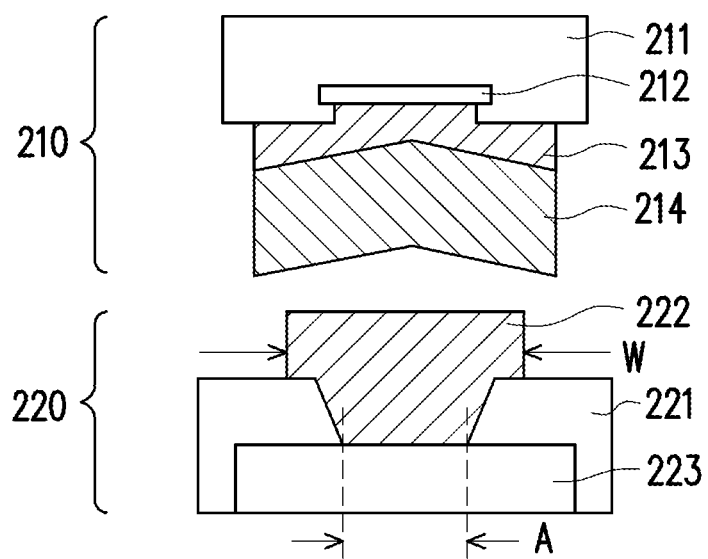
FIG. 5 is a cross-sectional view illustrating relative dimensions for elements of a joint assembly in accordance with the representative embodiment generally illustrated in FIG. 2A.

FIG. 5 representatively illustrates relative dimensions for elements subsequently forming a joint structure or assembly in accordance with the representative embodiment generally illustrated in FIG. 2A for first semiconductor device 210 and second semiconductor device 220. Width A represents a lateral width for the recessed portion of second contact pad 222. Width W represents a lateral width of second contact pad 222. Where the order of magnitude of widths W and A are about 1E-06 μm to about 1E-05 μm, a ratio of W:A of about 5:2 will produce a substantially planar front-side-facing (or top) surface of second contact pad 222. In a representative embodiment, width W may be about 50 μm and width A may be about 20 μm. W may be less than or equal to about 50 μm. A may be less than or equal to about 20 μm.

Figure 6:
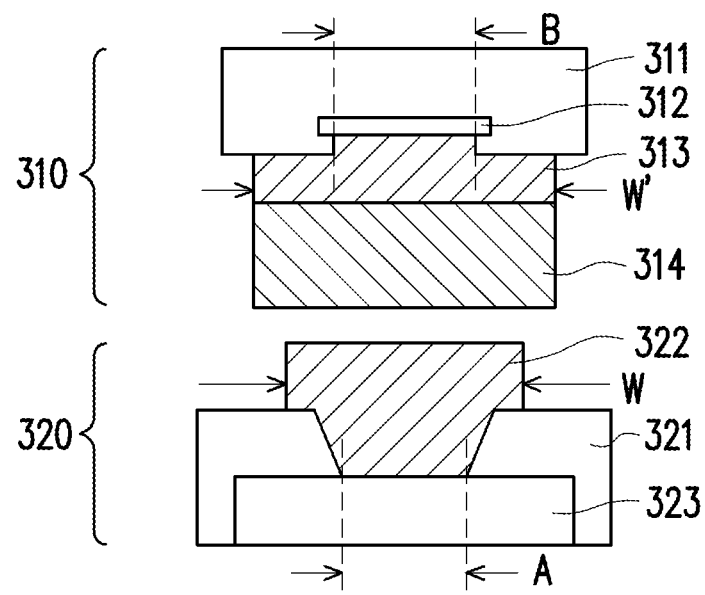
FIG. 6 is a cross-sectional view illustrating relative dimensions for elements of a joint assembly in accordance with the representative embodiment generally illustrated in FIG. 3A.

FIG. 6 representatively illustrates relative dimensions for elements subsequently forming a joint structure or assembly in accordance with the representative embodiment generally illustrated in FIG. 3A for first semiconductor device 310 and second semiconductor device 320. Width A represents a lateral width for the recessed portion of second contact pad 322. Width W represents a lateral width of second contact pad 322. Width B represents a lateral width for the recessed portion of first contact pad 313. Width W' represents a lateral width of first contact pad 313. Where the order of magnitude of widths W, W', A, and B are about 1E-06 μm to about 1E-05 μm, a ratio of W:A of about 5:2 will produce a substantially planar front-side-facing (or top) surface of second contact pad 322, and a ratio of W':B of about 5:2 will produce a substantially planar front-side-facing (or top) surface of first contact pad 313. Subsequent electroplating of solder layer 314 on first contact pad 313 will transfer the planar top surface shape of first contact pad 313 to the top surface of solder layer 314. In a representative embodiment, width W may be about 50 μm, width A may be about 20 μm, width W' may be about 50 μm, and width B may be about 20 μm. Width W may be less than or equal to about 50 μm. Width A may be less than or equal to about 20 μm. Width W' may be less than or equal to about 50 μm. Width B may be less than or equal to about 20 μm.

Figure 7:
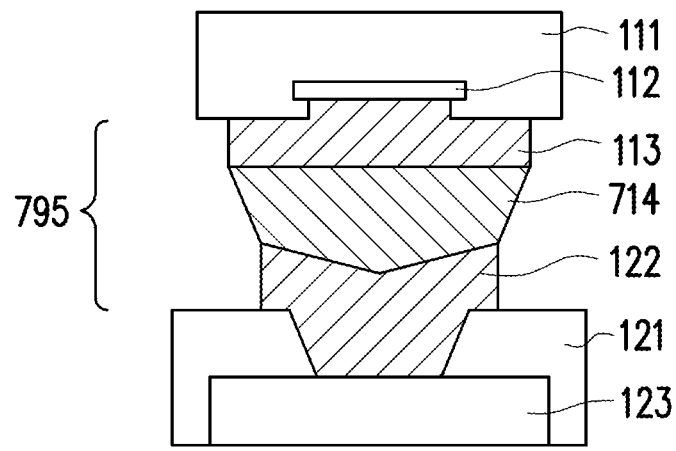
FIG. 7 is a cross-sectional view illustrating a tapered joint structure, in accordance with a representative embodiment.

FIG. 7 representatively illustrates a tapered joint structure 795 where the lateral extent width of first contact pad 113 is larger than the lateral extent width of second contact pad 122, in accordance with a representative embodiment. Solder layer 714 has a tapered sidewall profile that tapers in width from the top surface of first contact pad 113 to the top surface of second contact pad 122. That is to say, a lateral extent width of solder layer 714 measured along a dimension substantially parallel to a major surface of IPD package substrate 111 (or a major surface of encapsulant layer 121) diminishes or decreases in relation to measurements taken more proximate the top surface of first contact pad 113 compared with measurements taken less proximate the top surface of first contact pad 113, and the diminishment/decrease is a substantially continuous function in a direction toward the top surface of second contact pad 122.

Figure 8:
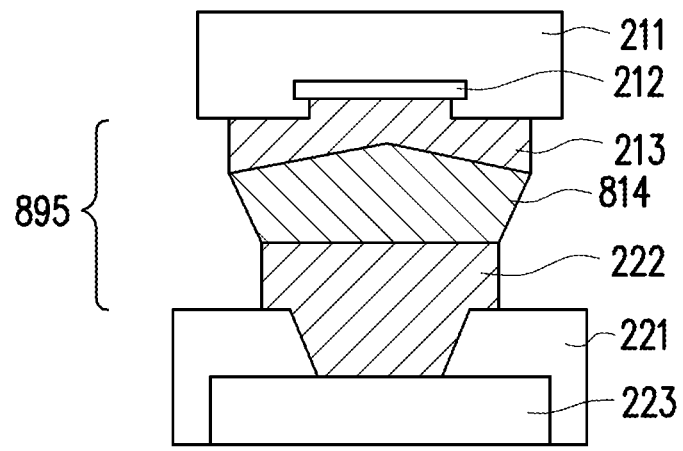
FIG. 8 is a cross-sectional view illustrating a tapered joint structure, in accordance with another representative embodiment.

FIG. 8 representatively illustrates a tapered joint structure 895 where the lateral extent width of first contact pad 213 is larger than the lateral extent width of second contact pad 222, in accordance with another representative embodiment. Solder layer 814 has a tapered sidewall profile that tapers in width from the top surface of first contact pad 213 to the top surface of second contact pad 222. That is to say, a lateral extent width of solder layer 814 measured along a dimension substantially parallel to a major surface of IPD package substrate 211 (or a major surface of encapsulant layer 221) enlarges or increases in relation to measurements taken more proximate the top surface of second contact pad 222 compared with measurements taken less proximate the top surface of second contact pad 222, and the enlargement/increase is a substantially continuous function in a direction toward the top surface of first contact pad 213.

Figure 9:
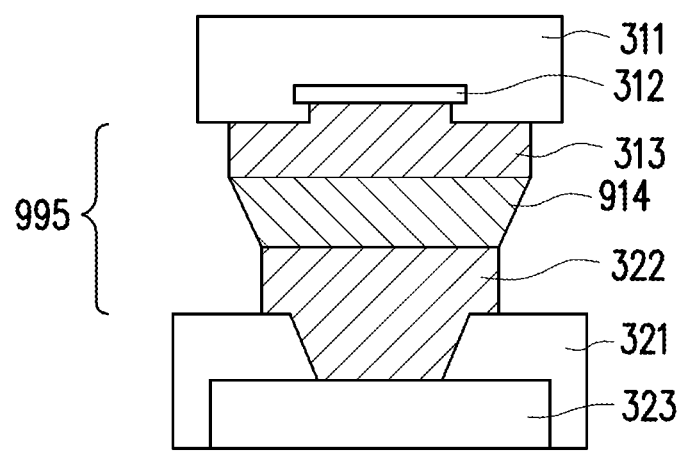
FIG. 9 is a cross-sectional view illustrating a tapered joint structure, in accordance with yet another representative embodiment.

FIG. 9 representatively illustrates a tapered joint structure 995 where the lateral extent width of first contact pad 313 is larger than the lateral extent width of second contact pad 322, in accordance with yet another representative embodiment. Solder layer 914 has a tapered sidewall profile that tapers in width from the top surface of first contact pad 313 to the top surface of second contact pad 322. That is to say, a lateral extent width of solder layer 914 measured along a dimension substantially parallel to a major surface of IPD package substrate 311 (or a major surface of encapsulant layer 321) diminishes or decreases in relation to measurements taken more proximate the top surface of first contact pad 313 and less proximate the second contact pad 322 compared with measurements taken less proximate the top surface of first contact pad 313 and more proximate the second contact pad 322, and the diminishment/decrease is a substantially continuous function in a direction toward the top surface of second contact pad 322.

Figure 10:
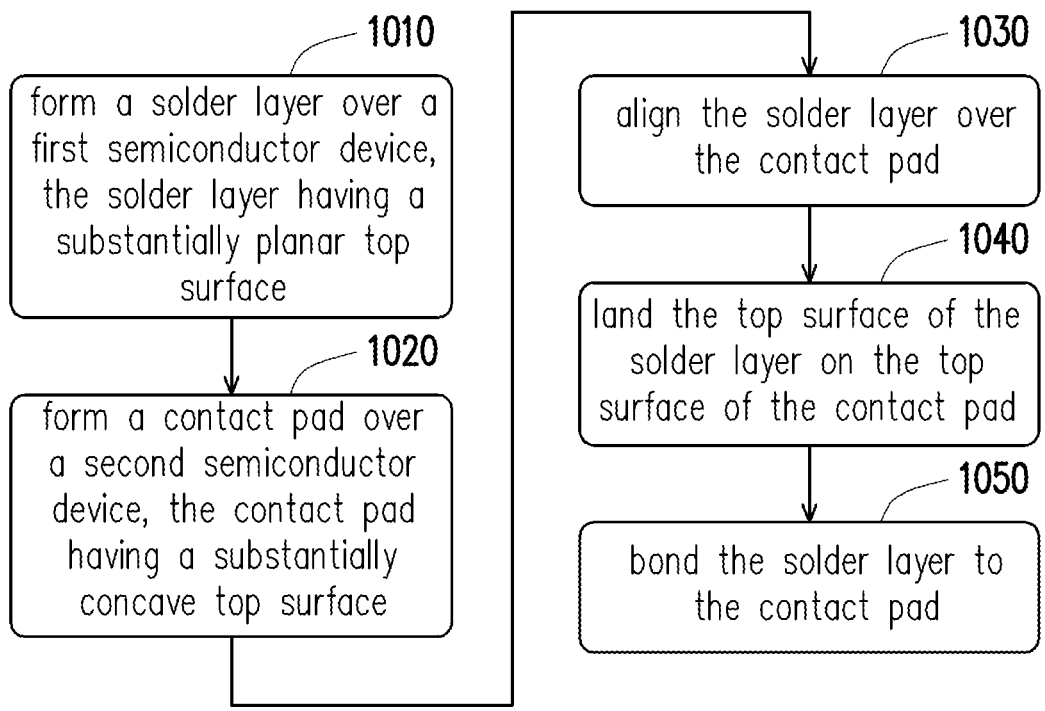
FIG. 10 is a flow diagram for a method of forming a joint structure, in accordance with a representative embodiment.

As representatively illustrated in FIG. 10, a method 1000 for forming a substantially void-free joint structure may comprise a step 1010 of forming a solder layer over a first semiconductor device, where the solder layer has a substantially planar top surface. The solder layer may be formed, e.g., by electroplating a contact pad of the first semiconductor device, where the contact pad has a substantially planar surface shape. In a subsequent step 1020, a contact pad is formed over a second semiconductor device, where the contact pad has a substantially concave top surface. In a further step 1030 the solder layer of the first semiconductor device is aligned over the contact pad of the second semiconductor device. In step 1040, the top surface of the solder layer of the first semiconductor device is landed on the top surface of the contact pad of the second semiconductor device. In step 1050, the solder layer of the first semiconductor device is bonded to the contact pad of the second semiconductor device, e.g., with the application of thermal energy.

Figure 11:
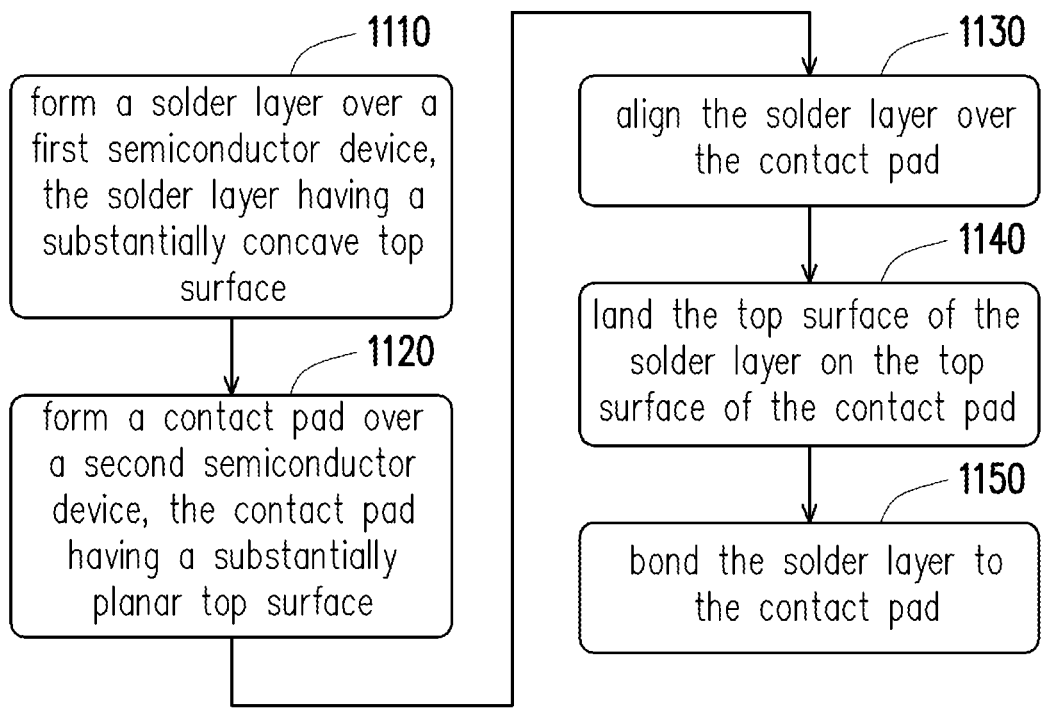
FIG. 11 is a flow diagram for a method of forming a joint structure, in accordance with another representative embodiment.

As representatively illustrated in FIG. 11, a method 1100 for forming a substantially void-free joint structure may comprise a step 1110 of forming a solder layer over a first semiconductor device, where the solder layer has a substantially concave top surface. The solder layer may be formed, e.g., by electroplating a contact pad of the first semiconductor device. The concave shape of the top surface of the solder layer may be achieved, e.g., by electroplating solder onto a contact pad of the first semiconductor device, where the contact pad has a substantially concave surface shape. In a subsequent step 1120, a contact pad is formed over a second semiconductor device, where the contact pad has a substantially planar top surface. In a further step 1130 the solder layer of the first semiconductor device is aligned over the contact pad of the second semiconductor device. In step 1140, the top surface of the solder layer of the first semiconductor device is landed on the top surface of the contact pad of the second semiconductor device. In step 1150, the solder layer of the first semiconductor device is bonded to the contact pad of the second semiconductor device, e.g., with the application of thermal energy.

Figure 12:
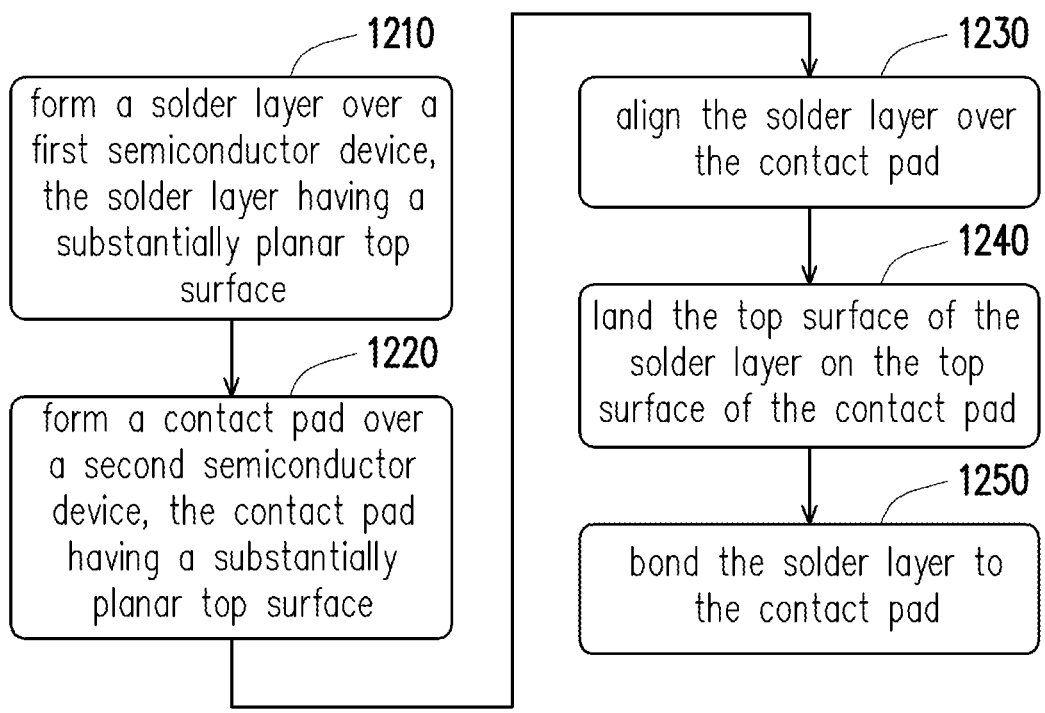
FIG. 12 is a flow diagram for a method of forming a joint structure, in accordance with yet another representative embodiment.

As representatively illustrated in FIG. 12, a method 1200 for forming a substantially void-free joint structure may comprise a step 1210 of forming a solder layer over a first semiconductor device, where the solder layer has a substantially planar top surface. The solder layer may be formed, e.g., by electroplating a contact pad of the first semiconductor device, where the contact pad has a substantially planar surface shape. In a subsequent step 1220, a contact pad is formed over a second semiconductor device, where the contact pad has a substantially planar top surface. In a further step 1230 the solder layer of the first semiconductor device is aligned over the contact pad of the second semiconductor device. In step 1240, the top surface of the solder layer of the first semiconductor device is landed on the top surface of the contact pad of the second semiconductor device. In step 1250, the solder layer of the first semiconductor device is bonded to the contact pad of the second semiconductor device, e.g., with the application of thermal energy.

Figure 13:
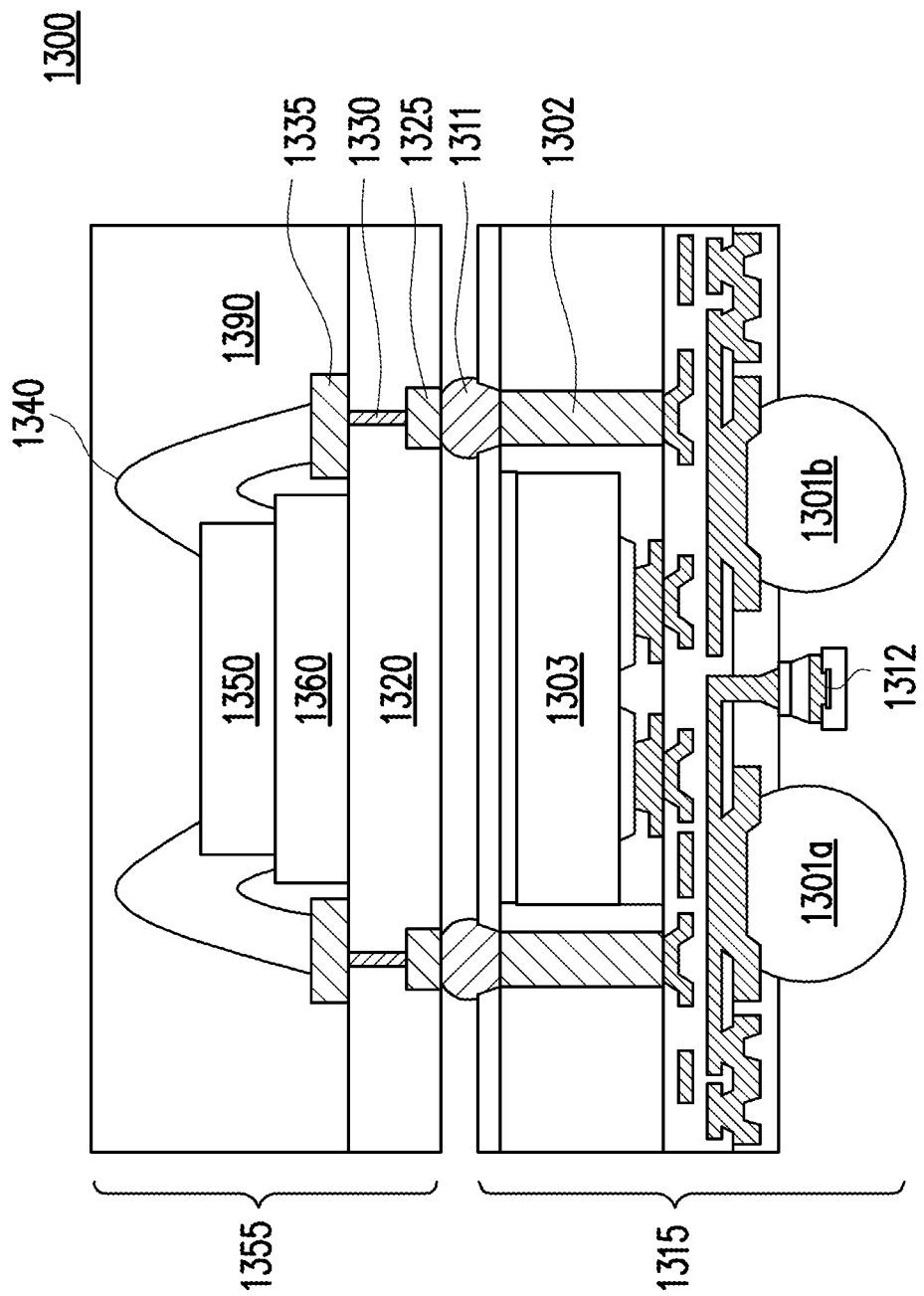
FIG. 13 is a cross-sectional view of a Package-on-Package (PoP) structure with a bonded integrated passive device (IPD) having a bond joint in accordance with a representative embodiment.

FIG. 13 representatively illustrates a Package-on-Package (PoP) structure 1300 including IPD 1312. PoP structure 1300 comprises first device package 1315 and second device package 1355. First device package 1315 comprises IPD 1312 bonded thereto. IPD 1312 may be bonded to first device package 1315 in accordance with various representative embodiments disclosed herein. Second device package 1355 includes a substrate 1320 and one or more stacked dies 1360 coupled to substrate 1320. Substrate 1320 may be, in one embodiment, based on an insulating core such as a fiberglass reinforced resin core. A representative core material comprises fiberglass resin such as FR4. Other core materials include bismaleimide-triazine (BT) resin, or alternatively, other printed circuit board (PCB) materials or films. Build up films, such as Ajinomoto build-up film (ABF) or other laminates, may be used for substrate 1320.

Substrate 1320 may include active and passive devices (not shown in Figures). In a representative embodiment, substrate 1320 may include an IPD, e.g., bonded to an underlying surface of second device package 1355, where the bonded IPD interposes first device package 1315 and second device package 1355. As one of ordinary skill in the art will appreciate, a variety of devices, such as transistors, capacitors, resistors, inductors, and/or the like, may be used to meet various structural and/or functional requirements of the design for PoP structure 1300. Such devices may be formed using any suitable methods.

Substrate 1320 may also include metallization layers (not illustrated) and through vias 1330. The metallization layers may be formed over active and passive devices, and are designed to connect various device components to form functional circuitry. The metallization layers may be formed of alternating layers of insulating (e.g., low-k dielectric) and conductive material (e.g., copper), with vias interconnecting the layers of conductive material, and may be formed using any suitable process (e.g., deposition, damascene, dual damascene, or the like). In some embodiments, substrate 1320 may be substantially free of active and passive devices.

Substrate 1320 may have bond pads 1335 on a first side of substrate 1320 to couple with stacked dies 1360, and bond pads 1325 on a second side of substrate 1320, the second side being opposite the first side of substrate 1320, to couple with conductive connectors 1311. Stacked dies 1360 may be coupled to substrate 1320 by wire bonds 1340, although other connections may be used, such as, e.g., conductive bumps. In a representative embodiment, stacked dies 1350, 1360 may comprise, e.g., stacked memory dies. Stacked memory dies may include low-power (LP) double data rate (DDR) memory modules, such as LPDDR1, LPDDR2, LPDDR3, or like memory modules, or combinations thereof. In some embodiments, stacked dies 1350, 1360 and wire bonds 1340 may be encapsulated by a molding material 1390.

After second device packages 1355 are formed, second device packages 1355 may be bonded to first device packages 1315 by way of conductive connectors 1311, bond pads 1325, and electrical connectors 1302. In some embodiments, stacked memory dies 1350, 1360 may be coupled to IC dies 1303 through wire bonds 1340, bond pads 1335, 1325, through vias 1330, conductive connectors 1311, and electrical connectors 1302. IC dies 1303 may comprise a semiconductor substrate, such as silicon (doped or undoped) or an active layer of a semiconductor-on-insulator (SOI) substrate. A semiconductor substrate may include other semiconductor material, e.g., germanium, a compound semiconductor (e.g., silicon carbide, gallium arsenic, gallium phosphide, indium phosphide, indium arsenide, indium antimonide), an alloy semiconductor (e.g., SiGe, GaAsP, AlInAs, AlGaAs, GaInAs, GaInP, GaInAsP), and/or the like. Other substrates, such as multi-layered or gradient substrates, may also be used. Devices, such as transistors, diodes, capacitors, resistors, inductors, etc., may be formed in and/or on the semiconductor substrate, and may be interconnected by interconnect structures formed, e.g., with metallization patterns in one or more insulating layers of the semiconductor substrate to form an integrated circuit.

Conductive connectors 1311 may be similar to conductive connectors 1301a, 1301b. Conductive connectors 1301a, 1301b, 1311 may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. Conductive connectors 1301a, 1301b, 1311 may include a conductive material such as solder, copper, aluminum, gold, nickel, silver, palladium, tin, or the like, or a combination thereof. In some embodiments, conductive connectors 1301a, 1301b, 1311 may be formed by initially depositing a layer of solder using various methods, e.g., evaporation, electroplating, printing, solder transfer, ball placement, or the like. Once a layer of solder has been formed on the structure, a thermal treatment (e.g., reflow) may be performed in order to shape the material into the desired bump shapes. In another embodiment, conductive connectors 1301a, 1301b, 1311 may comprise metal pillars (e.g., a copper pillar) formed by sputtering, printing, electroplating, electroless plating, CVD, or the like. Metal pillars may be substantially solder-free. In some embodiments, a metal cap layer may be formed over the metal pillar connectors. The metal cap layer may include nickel, tin, tin-lead, gold, silver, palladium, indium, nickel-palladium-gold, nickel-gold, or the like, or a combination thereof, and may be formed by a plating process. In accordance with a representative embodiment, conductive connectors 1301a, 1301b, 1311 may comprise solder balls having a diameter ranging from, e.g., about 150 µm to about 300 µm. Conductive connectors 1311 and 1301a, 1301b need not be the same.

As one of ordinary skill in the art will appreciate, a variety of devices, such as transistors, capacitors, resistors, inductors, and/or the like, may be used to meet structural and/or functional requirements of the design for PoP structure 1300, and may be formed using any suitable methods. In some embodiments, PoP structure 1300 may be bonded to a package substrate (not illustrated), e.g., with conductive connectors 1301a, 1301b. In an embodiment, PoP structure 1300 may be bonded to a package substrate (not illustrated) where the package substrate may be substantially free of active and passive devices. PoP structure 1300 may comprise an integrated fan out (InFO) device package structure, although any suitable device package structure may be used.

In a representative embodiment, a method of manufacturing a semiconductor device, the method comprises the steps of: providing a first semiconductor device and a second semiconductor device, the first semiconductor device comprising a first contact pad, the second semiconductor device comprising a second contact pad; forming a substantially concave surface profile on the first contact pad or the second contact pad; electroplating a solder layer on the first contact pad; aligning the solder layer over the second contact pad; landing the solder layer on the second contact pad; and bonding the solder layer to the second contact pad, wherein one of the solder layer or the second contact pad has a substantially concave shape prior to bonding. The solder layer has a surface contour profile that is substantially similar to the surface contour profile of the first contact pad. The first semiconductor device may comprise an integrated passive device (IPD). The IPD may comprise a capacitor, a resistor, an inductor, or a diode. The first semiconductor device may comprise an impedance matching circuit, a harmonic filter, a bandpass filter, a low pass filter, a high pass filter, a coupler, a balun, a power combiner, or a power divider. The second semiconductor device may comprise a Package-on-Package (PoP) device. One of the second contact pad or the solder layer may have a substantially planar top surface prior to bonding. The substantially concave shape may comprise a cavity depth from about 1 µm to about 7 µm.

In another representative embodiment, a method of forming a semiconductor device comprises the steps of: providing a first semiconductor device and a second semiconductor device, the second semiconductor device comprising a contact pad, the contact pad having a first surface; electroplating a solder layer on a portion of the first semiconductor device, the solder layer having a second surface; aligning the first surface over the second surface; landing the first surface on the second surface; and bonding the first surface to the second surface, wherein the first surface and the second surface are substantially planar prior to bonding. The first semiconductor device may comprise an IPD. The IPD may comprise a capacitor, a resistor, an inductor, or a diode. The first semiconductor device may comprise an impedance matching circuit, a harmonic filter, a bandpass filter, a low pass filter, a high pass filter, a coupler, a balun, a power combiner, or a power divider. The second semiconductor device may comprise a PoP device.

In yet another representative embodiment, a device package may comprise a first semiconductor device comprising an IPD and a first contact pad disposed over the IPD, where a first portion of the first contact pad is disposed in a first recessed opening of an exterior portion of the first semiconductor device. The first portion is coupled to the IPD. The first contact pad has a first surface comprising first lateral extents. A second semiconductor device comprises a redistribution layer (RDL) and a second contact pad disposed over the RDL, where a second portion of the second contact pad is disposed in a second recessed opening of an exterior portion of the second semiconductor device. The second portion is coupled to the RDL. The second contact pad has a second surface comprising second lateral extents. A first distance spanning the second lateral extents is less than a second distance spanning the first lateral extents. A joint structure interposes the first semiconductor device and the second semiconductor device, the joint structure comprises the first contact pad, the second contact pad, and a solder layer. The solder layer interposes the first contact pad and the second contact pad. The solder layer has a tapered sidewall profile extending with a continuously diminishing width from the first surface to the second surface. At least one of the first surface or the second surface is substantially planar. The first distance may be less than or equal to about 50 µm. The second distance may be less than or equal to about 49 µm. A first width of the first recessed opening may be less than or equal to about 20 µm. A second width of the second recessed opening may be less than or equal to about 20 µm. At least one of the first contact pad or the second contact pad may comprise copper, and the solder layer may comprise tin. The second semiconductor device may comprise a Package-on-Package (PoP) device. The IPD may comprise a capacitor, a resistor, an inductor, or a diode. The first semiconductor device may comprise an impedance matching circuit, a harmonic filter, a bandpass filter, a low pass filter, a high pass filter, a coupler, a balun, a power combiner, or a power divider. The solder layer may comprise a substantially continuous distribution of material between the first surface and the second surface. The solder layer has third lateral extents, where a third distance spanning the third lateral extents is less than or equal to the second distance. The solder layer, in a cross-sectional elevation view, may comprise a portion having a substantially oblate hemispheroidal shape along a principle axis extending vertically from the second surface to the first surface.

The foregoing outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments described herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a first semiconductor device and a second semiconductor device, the first semiconductor device comprising a first contact pad and a substrate, the first contact pad having a second surface contacting a metal feature of the substrate, the first contact pad having a first surface facing away from the substrate, the second semiconductor device comprising an encapsulant, a redistribution layer, and a second contact pad contacting the redistribution layer, the second contact pad having a third surface facing the first surface, the second contact pad having a fourth surface contacting the redistribution layer, the encapsulant contacting sidewalls of the redistribution layer, a top surface of the redistribution layer, and sidewalls of the second contact pad;
   forming a substantially concave surface profile on one of the first surface or the third surface, the other of the first surface or the third surface having a substantially planar surface profile, wherein the second surface of the first contact pad or the fourth surface of the second contact pad comprising the other of the first surface or the third surface has a first width, wherein the other of the first surface or the third surface has a second width, and wherein a ratio of the second width to the first width is 5:2;
   electroplating a solder layer on the first surface of the first contact pad, the solder layer having a fifth surface facing away from the first surface, wherein the first surface and the fifth surface have a same surface contour profile;
   aligning the solder layer over the second contact pad;
   landing the fifth surface of the solder layer directly on the third surface of the second contact pad; and
   bonding the solder layer to the second contact pad to form a joint structure, the joint structure having a sixth surface in contact with the first surface, the sixth surface having a third width equal to a width of the first surface, the joint structure having a seventh surface in contact with the third surface, the seventh surface having a fourth width equal to a width of the third surface, the joint structure having sidewalls which taper from the third width to the fourth width.

2. The method of claim 1, wherein providing the first semiconductor device comprises providing an integrated passive device (IPD).

3. The method of claim 2, wherein providing the IPD further comprises providing an impedance matching circuit, a harmonic filter, a bandpass filter, a low pass filter, a high pass filter, a coupler, a balun, a power combiner, or a power divider.

4. The method of claim 2, wherein providing the IPD further comprises providing a capacitor, a resistor, an inductor, or a diode.

5. The method of claim 1, wherein providing the second semiconductor device comprises providing a Package-on-Package (PoP) device.

6. The method of claim 1, wherein the substantially planar surface profile is formed on the second contact pad or the first contact pad prior to bonding the solder layer to the second contact pad.

7. The method of claim 1, wherein the substantially concave surface profile is formed with a cavity depth from about 1 µm to about 7 µm.

8. A method of forming a semiconductor device, the method comprising:
   providing a first semiconductor device and a second semiconductor device, the second semiconductor device comprising a contact pad, the contact pad having a first substantially planar surface and a second surface opposite the first substantially planar surface, the second surface contacting a metal feature, the second surface having a first width, the first substantially planar surface having a second width, wherein a ratio of the second width to the first width is 5:2, wherein the first substantially planar surface is an outermost surface of the contact pad;

electroplating a solder layer on a second contact pad of the first semiconductor device, the solder layer having a second substantially planar surface, the second contact pad having a first surface facing the solder layer, the first surface having a third width and being substantially planar, the second contact pad having a third surface opposite the first surface, the third surface having a fourth width, wherein a ratio of the third width to the second width is 5:2;

aligning the first substantially planar surface over the second substantially planar surface;

landing the first substantially planar surface on the second substantially planar surface, wherein the first substantially planar surface directly adjoins the second substantially planar surface; and bonding the first substantially planar surface to the second substantially planar surface with a joint structure being formed from the solder layer between the second contact pad and the contact pad, wherein the joint structure has tapered sidewalls continuously diminishing from a fifth width at a fourth surface of the joint structure adjoining the second contact pad to a sixth width at a fifth surface of the joint structure adjoining the contact pad, the fifth width being equal to the third width, and the sixth width being equal to the second width.

9. The method of claim 8, wherein providing the first semiconductor device comprises providing an integrated passive device (IPD).

10. The method of claim 9, wherein providing the IPD further comprises providing an impedance matching circuit, a harmonic filter, a bandpass filter, a low pass filter, a high pass filter, a coupler, a balun, a power combiner, or a power divider.

11. The method of claim 9, wherein providing the IPD comprises providing a capacitor, a resistor, an inductor, or a diode.

12. The method of claim 9, wherein providing the second semiconductor device comprises providing a Package-on-Package (PoP) device.

13. A method, comprising:
forming a first semiconductor device, wherein forming the first semiconductor device comprises disposing a first contact pad over an integrated passive device (IPD), wherein a first portion of the first contact pad is disposed in a first recess of the first semiconductor device, the first portion is coupled to the IPD, and the first contact pad has a first surface opposite the IPD, the first surface comprising first lateral extents spanning a first distance;

forming a second semiconductor device, wherein forming the second semiconductor device comprises disposing a second contact pad over a redistribution layer (RDL), wherein a second portion of the second contact pad is disposed in a second recess of the second semiconductor device, the second portion is coupled to the RDL, the second portion has tapered sidewalls, a third portion of the second contact pad extends over a topmost surface of the second semiconductor device, the third portion has vertical sidewalls, and the second contact pad has a second surface opposite the RDL, the second surface comprising second lateral extents spanning a second distance, wherein the second distance is less than the first distance;

electroplating a solder layer on the first surface of the first contact pad; and after the electroplating, forming a joint structure between the first semiconductor device and the second semiconductor device, wherein forming the joint structure comprises reflowing the solder layer between the first contact pad and the second contact pad, wherein after the reflowing, the solder layer has a tapered sidewall profile extending with a continuously diminishing width from the first surface to the second surface, the solder layer comprising a third surface proximal the first contact pad and a fourth surface proximal the second contact pad, the third surface having third lateral extents spanning a third distance equal to the first distance, the fourth surface having fourth lateral extents spanning a fourth distance equal to the second distance, wherein at least one of the first surface or the second surface is substantially planar, wherein the first contact pad comprises a fifth surface coupled to the IPD, the fifth surface having fifth lateral extents spanning a fifth distance, wherein the second contact pad comprises a sixth surface coupled to the RDL, the sixth surface having sixth lateral extents spanning a sixth distance, wherein at least one of a ratio of the first distance to the fifth distance or a ratio of the second distance to the sixth distance is 5:2.

14. The method of claim 13, wherein:
forming the first semiconductor device further comprises the first distance being less than or equal to about 50 µm;
forming the second semiconductor device further comprises the second distance being less than or equal to about 49 µm;
forming the first semiconductor device further comprises a first width of the first recess being less than or equal to about 20 µm; and
forming the second semiconductor device further comprises a second width of the second recess being less than or equal to about 20 µm.

15. The method of claim 13, wherein at least one of:
forming the first semiconductor device further comprises the first contact pad comprising copper;
forming the second semiconductor device further comprises the second contact pad comprising copper; or
forming the joint structure further comprises the solder layer comprising tin.

16. The method of claim 13, wherein forming the second semiconductor device further comprises the second semiconductor device comprising a Package-on-Package (PoP) device.

17. The method of claim 16, wherein forming the first semiconductor device further comprises the IPD comprising a capacitor, a resistor, an inductor, or a diode.

18. The method of claim 17, wherein forming the first semiconductor device further comprises the first semiconductor device comprising an impedance matching circuit, a harmonic filter, a bandpass filter, a low pass filter, a high pass filter, a coupler, a balun, a power combiner, or a power divider.

19. The method of claim 13, wherein forming the joint structure further comprises the solder layer comprising a substantially continuous distribution of material.

20. The method of claim 19, wherein forming the joint structure further comprises the solder layer having third lateral extents spanning a third distance, wherein the third distance is less than or equal to the second distance.

* * * * *